(12) United States Patent
Kawamura et al.

(10) Patent No.: US 8,931,432 B2
(45) Date of Patent: Jan. 13, 2015

(54) VACUUM PROCESSING APPARATUS

(75) Inventors: Keisuke Kawamura, Nagasaki (JP);
Hiroshi Mashima, Nagasaki (JP)

(73) Assignee: Mitsubishi Heavy Industries, Ltd., Minato-ku, Tokyo (JP)

( * ) Notice: Subject to any disclaimer, the term of this patent is extended or adjusted under 35 U.S.C. 154(b) by 506 days.

(21) Appl. No.: 12/309,634

(22) PCT Filed: Feb. 18, 2008

(86) PCT No.: PCT/JP2008/052677
§ 371 (c)(1),
(2), (4) Date: Jan. 26, 2009

(87) PCT Pub. No.: WO2008/102738
PCT Pub. Date: Aug. 28, 2008

(65) Prior Publication Data
US 2010/0009096 A1    Jan. 14, 2010

(30) Foreign Application Priority Data

Feb. 19, 2007  (JP) ................................. 2007-037852

(51) Int. Cl.
*C23C 16/00* (2006.01)
*C23F 1/00* (2006.01)
(Continued)

(52) U.S. Cl.
CPC .............. *C23C 16/509* (2013.01); *C23C 16/24* (2013.01); *H01J 37/32091* (2013.01);
(Continued)

(58) Field of Classification Search
USPC ...... 118/715, 722, 723 R, 723 E; 156/345.43, 156/345.44, 345.45, 345.46, 345.47; 315/111.21
See application file for complete search history.

(56) References Cited

U.S. PATENT DOCUMENTS

| | | | | |
|---|---|---|---|---|
| 6,239,404 B1* | 5/2001 | Lea et al. | .................. | 219/121.54 |
| 2003/0052085 A1* | 3/2003 | Parsons | ........................... | 216/60 |

(Continued)

FOREIGN PATENT DOCUMENTS

| | | |
|---|---|---|
| JP | 2001-007028 | 1/2001 |
| JP | 2001-507181 | 5/2001 |

(Continued)

OTHER PUBLICATIONS

Kawamura, K. JP2006-066779, Mar. 2006, Engl. machine translation of full document.*

(Continued)

*Primary Examiner* — Maureen Gramaglia
(74) *Attorney, Agent, or Firm* — Benjamin Hauptman; Manabu Kanesaka; Kenneth Berner

(57) ABSTRACT

A vacuum processing apparatus is provided, in which a deposition characteristic is easily adjusted, and occurrence of difference in deposition characteristic between deposition chambers can be suppressed, and reduction in equipment cost can be achieved, and a deposition method using the vacuum processing apparatus is provided. The vacuum processing apparatus is characterized by having a plurality of discharge electrodes (3a to 3h) that are supplied with high-frequency power from a power supply unit (17a) through both ends (53) thereof, and form plasma with respect to a substrate (8) respectively, and a plurality of matching boxes (3a to 3*ht*) which tune phases and amplitudes of the high-frequency power supplied to the plurality of discharge electrodes (3a to 3h) at the ends (53) respectively; wherein impedance of the plurality of matching boxes (3a to 3*ht*) are set to approximately the same value, and the impedance value is a value at which reflected power is approximately minimized, the reflected power being returned to the power supply unit (17a) from one discharge electrode among the plurality of discharge electrodes (3a to 3h).

6 Claims, 6 Drawing Sheets

(51) Int. Cl.
*H01L 21/306* (2006.01)
*C23C 16/509* (2006.01)
*C23C 16/24* (2006.01)
*H01J 37/32* (2006.01)
*H01L 21/02* (2006.01)

(52) U.S. Cl.
CPC .... *H01J 37/32183* (2013.01); *H01L 21/02532* (2013.01); *H01L 21/0262* (2013.01)
USPC .................................. 118/723 E; 156/345.44

(56) References Cited

U.S. PATENT DOCUMENTS

| | | | |
|---|---|---|---|
| 2003/0057847 A1 | 3/2003 | Strang | |
| 2003/0079983 A1* | 5/2003 | Long et al. | 204/164 |
| 2006/0237391 A1 | 10/2006 | Aramaki et al. | |

FOREIGN PATENT DOCUMENTS

| | | |
|---|---|---|
| JP | 2005-85917 | 3/2005 |
| JP | 2005-113178 | 4/2005 |
| JP | 2005-113878 | 4/2005 |
| JP | 2006-066779 | 3/2006 |
| JP | 2006-156839 | 6/2006 |
| JP | 2006-278862 | 10/2006 |
| WO | WO 01/73814 A2 | 10/2001 |
| WO | 2007/010851 A1 | 1/2007 |

OTHER PUBLICATIONS

English Machine Translation of JP 2005-113178 A. Obtained on Aug. 23, 2013 from http://www19.ipdl.inpit.go.jp/PA1/cgi-bin/PA1DETAIL.*
Japan Patent Office, Decision to Grant a Patent, Sep. 25, 2012.
The State Intellectual Property Office of the People'S Republic of China, "Notification of the Grant of Patent Right for Invention for CN 200880000572.2", Dec. 5, 2012.
European Patent Office, "Extended European Search Report for RP 08 71 1501", Apr. 5, 2013.
India Patent Office, "Office Action for 417/KOLNP/2009," Jan. 20, 2014.

* cited by examiner

VACUUM PROCESSING APPARATUS

TECHNICAL FIELD

The present invention relates to a vacuum processing apparatus, and particularly relates to a vacuum processing apparatus that performs processing of a substrate by using plasma.

BACKGROUND ART

Recently, a plasma CVD apparatus using a plasma enhanced chemical vapor deposition (PCVD) method is used to deposit a material such as silicon onto a substrate having a large area (for example, at least 1 m in length and at least 1 m in width). The plasma CVD apparatus is used for deposition processing of a film including amorphous silicon, microcrystalline silicon, silicon nitride and the like used for, for example, an amorphous solar cell, a microcrystalline solar cell, and a TFT (Thin Film Transistor) for a liquid crystal display, and has a function of cleaning a film adhered on a chamber or a discharge electrode by etching (self-cleaning).

As the discharge electrode of the plasma CVD apparatus, a discharge electrode including rod-like, longitudinal electrodes arranged approximately in parallel is often used, and such a discharge electrode is suitable for use in an very-high-frequency (30 MHz to 300 MHz) power supply to deposit a thin film onto a substrate having a large area (for example, refer to Patent Citation 1).

Patent Citation 1: Japanese Unexamined Patent Application, Publication No. 2005-113878

DISCLOSURE OF INVENTION

The discharge electrode having the above configuration is configured such that a plurality of discharge electrodes are arranged to be approximately parallel to a substrate surface to be subjected to deposition processing, and vertical ends being feeding points of each of the discharge electrodes are electrically connected to a high-frequency power supply, and high-frequency power is supplied from the high-frequency power supply to each of the discharge electrodes.

A matching box is provided near a feeding point of each discharge electrode. The matching box tunes a phase and an amplitude of supplied high-frequency power. In each matching box, tuning is performed to minimize reflected power returned from each discharge electrode to the high-frequency power supply.

However, in a case in which frequency of the high-frequency power is included in a range of ten megahertz to hundreds of megahertz, tuning itself is difficult to perform, leading to a problem that it is difficult to adjust the reflected power to achieve a minimum.

When a plurality of discharge electrodes are individually subjected to tune to minimize reflected power, since respective discharge electrodes affect one another due to plasma or other factors, an untuned discharge electrode and a tuned discharge electrode interfere with each other, resulting in a plurality of tuning points at which reflected power is minimized.

In such tuning points, even if reflected power is reduced at a feeding point of each discharge electrode, phases of the high-frequency power supplied to respective discharge electrodes may not be uniform or different from one another, and electrical interference may occur between the respective discharge electrodes.

In this case, when plasma is formed between a discharge electrode configured by combinatorially arranging a plurality of discharge electrodes and a substrate placed on a counter electrode to deposit a film on the substrate, thickness distribution of the film may be poor. From a large number of deposition evaluation tests, it has been found that since a number of such tuning points of matching boxes that causes poor thickness distribution exist, there is high probability that a film having poor thickness distribution may be formed, leading to reduction in uniformity or reproducibility.

Since there is no means of measuring an amplitude of the high-frequency power supplied to a plurality of discharge electrodes, the amplitude of the high-frequency power supplied to the respective discharge electrodes have been difficult to be made uniform. Therefore, it was found that even if reflected power is minimized by tune, in a case in which the amplitudes of the high-frequency power supplied to respective discharge electrodes are nonuniform, the plasma is also nonuniformly formed, consequently a film having bad thickness distribution was possibly formed, leading to reduction in uniformity or reproducibility.

On the other hand, as a method of making thickness distribution of a deposited film to be uniform while keeping low reflected power, a method is considered, in which a phase of supplied power is tuned for each of feeding points of a plurality of discharge electrodes. However, in the method, in a case in which impedance values of respective matching boxes are nonuniform and different from one another, it has not been possible to make a thickness distribution adequately uniform. For a high-frequency feeding system, a phase tuning means was necessary to be provided for each power supply, leading to a problem of an increase in equipment cost.

Furthermore, in a plasma CVD apparatus having a plurality of deposition chambers, since a plurality of discharge electrodes are subjected to tune for each deposition chamber to minimize the reflected power, a deposition characteristic in each deposition chamber, namely, a thickness distribution of a deposited film has been different for each deposition chamber, leading to a problem of complicated production management.

The invention was made to solve these problems, and an object of the invention is to provide a vacuum processing apparatus in which a deposition characteristic is easily adjusted to achieve a uniform thickness distribution, and to suppress an occurrence of a difference in deposition characteristic between deposition chambers, and in addition, to reduce an equipment cost, and to provide a deposition method using the vacuum processing apparatus.

That is, it was found that it is extremely important for improving uniformity and reproducibility of the thickness distribution that impedance values of respective matching boxes connected to feeding points of a plurality of discharge electrodes are made uniform, and then tuning is performed so as to approximately minimize a reflected wave at each feeding portion, whereby phases and amplitude are made uniform at respective feeding points.

To achieve the object, the invention provides the following means.

A first aspect of the invention provides a vacuum processing apparatus including a plurality of discharge electrodes that are supplied with high-frequency power from a power supply unit through feeding points thereof, and form plasma with respect to a substrate placed on a counter electrode respectively, and a plurality of matching boxes which tune phases and amplitudes of the high-frequency power supplied to the plurality of discharge electrodes at the feeding points respectively; wherein impedance values of the plurality of matching boxes are set to approximately the same value, and the impedance value is a value at which reflected power is approximately minimized, the reflected power being returned to the power supply unit from one discharge electrode among the plurality of discharge electrodes.

According to the first aspect of the invention, a difference does not exist in the impedance value between a plurality of matching boxes, or even if such difference exists, the difference is small, consequently a variation in the thickness distribution of a film deposited on a substrate is suppressed. Since the impedance values of the plurality of matching boxes are adjusted to an impedance value at which reflected power returned from one discharge electrode is approximately minimized, reflected power returned from a plurality of discharge electrodes are reduced, so that the high-frequency energy supplied to the plurality of discharge electrodes is increased and therefore a deposition rate is increased.

Here, the description that reflected power is approximately minimized means that a difference between a minimum value of a reflected wave and a reflection value after tuning is at most 20%, and more preferably at most 10% of the supplied power, which implies tuning into a state that a reflected wave substantially has an approximate minimum value.

Since an impedance value of a matching box can be measured by a measuring instrument such as network analyzer, the impedance values of a plurality of matching boxes can be easily made uniform compared with a method where phases and amplitudes of the high-frequency power are individually made uniform so that variation in thickness distribution is suppressed. Therefore, phases and amplitudes can be made uniform at respective feeding points, and thereby variation in thickness distribution is suppressed, leading to a uniform thickness distribution.

Compared with a method where a phase tuning means is disposed for each power supply unit to tune a phase of the high-frequency power, a phase tuning function need not be individually provided, leading to reduction in equipment cost.

In the first aspect of the invention, the plurality of matching boxes desirably include phase tuning sections that tune the phases of the high-frequency power supplied to the plurality of discharge electrodes respectively, and amplitude tuning sections that tune the amplitudes of the high-frequency power respectively.

According to this, since impedance values of a plurality of matching boxes can be adjusted by the phase tuning section and the amplitude tuning section, the impedance values of the plurality of matching boxes are easily set to approximately the same value.

A second aspect of the invention provides a deposition method using a vacuum processing apparatus, the method having a reflected-power tuning step, in which among a plurality of matching boxes that tune phases and amplitudes of high-frequency power supplied to a plurality of discharge electrodes that form plasma with respect to a substrate placed on a counter electrode respectively, impedance of one matching box, which tunes the high-frequency power supplied to one discharge electrode, is set such that reflected power returned from the one discharge electrode is approximately minimized, and a setting step, in which an impedance of the other matching boxes are set to approximately the same impedance as the impedance of the one matching box.

According to the second aspect of the invention, a difference does not exist in the impedance value between the plurality of matching boxes, or even if such a difference exists, the difference is small, consequently a variation in the thickness distribution of a film deposited on a substrate is suppressed. Since the impedance values of the plurality of matching boxes are adjusted to an impedance value at which a reflected power returned from one discharge electrode is approximately minimized, reflected power returned from a plurality of discharge electrodes are reduced, so that high-frequency energy supplied to the plurality of discharge electrodes is increased and therefore a deposition rate is increased.

Since an impedance value of a matching box can be measured by a measuring instrument such as network analyzer, the impedance values of the plurality of matching boxes can be easily made uniform compared with a method where phases and amplitudes of high-frequency power are individually made uniform so that a variation in the thickness distribution is suppressed. Therefore, phases and amplitude can be made uniform at respective feeding points, and thereby a variation in the thickness distribution can be suppressed, leading to uniform thickness distribution.

Compared with a method where a phase tuning means is disposed for each power supply unit to tune a phase of high-frequency power, a phase tuning function need not be individually provided, leading to reduction in equipment cost.

The second aspect of the invention desirably has a configuration where an amplitude tuning step is included after the setting step, in which the amplitude of the high-frequency power supplied to the plurality of discharge electrodes are tuned with the same change amount, so that a point is selected, at which reflected power returned from the plurality of discharge electrodes is relatively small.

According to this, since amplitudes of the high-frequency power supplied to the plurality of discharge electrodes are tuned with the same change amount, impedance values of the plurality of matching boxes are kept to approximately the same value, and reflected power returned from the plurality of discharge electrodes is reduced compared with reflected power before tuning the amplitude.

Compared with a method where reflected power is further reduced by individually tuning phases of the high-frequency power supplied to the plurality of discharge electrodes, since the impedance values of the plurality of matching boxes are approximately the same, the phases and amplitudes can be made uniform at respective feeding points, and consequently a variation in thickness distribution of a film deposited on a substrate can be suppressed, leading to uniform thickness distribution.

In the above configuration, an amplitude change step is desirably included after the setting step, in which an amplitude of the supplied high-frequency power is changed only for the discharge electrode having a large reflected power among the plurality of discharge electrodes, so that a point is selected, at which reflected power returned from the discharge electrode having a large reflected power is relatively small.

According to this, compared with a method where the impedance values of a plurality of matching boxes are kept to approximately the same, since the reflected power returned from the discharge electrode having a large reflected power is relatively small, reflected power returned from the plurality of discharge electrodes as a whole becomes relatively small, so that high-frequency power supplied to the plurality of discharge electrodes is increased and consequently a deposition rate is increased.

According to a deposition method using the vacuum processing apparatus according to the first aspect of the invention and the vacuum processing apparatus according to the second aspect thereof, since impedance values are set to approximately the same value among a plurality of matching boxes, the following advantages are provided: phases and amplitudes can be made uniform at respective feeding points, so that a deposition characteristic can be easily adjusted to achieve a uniform thickness distribution, and an occurrence of a difference in deposition characteristic between respective deposition chambers, or occurrence of difference in deposition characteristic between deposition processing batches can be suppressed, and in addition, equipment cost is reduced.

Particularly, in a case in which an amorphous solar cell or a microcrystalline solar cell is manufactured by the deposition method using the vacuum processing apparatus, power generation characteristics can be improved, and a yield can be improved.

EXPLANATION OF REFERENCE

1: thin-film manufacturing apparatus (vacuum processing apparatus)
3, 3a, 3b, 3c, 3d, 3e, 3f, 3g, 3h: discharge electrode
13at, 13bt, 13ct, 13dt, 13et, 13ft, 13gt, 13ht, 13ab, 13bb, 13cb, 13db, 13eb, 13fb, 13gb, 13hb: matching box
53, 54: feeding point (end)
17a, 17b: high-frequency power supply (power supply unit)
23T: first capacitor (phase tuning section)
25M: second capacitor (amplitude tuning section)

BEST MODE FOR CARRYING OUT THE INVENTION

First Embodiment

Hereinafter, a first embodiment of the invention will be described with reference to FIGS. 1 to 8.

Figure 1:
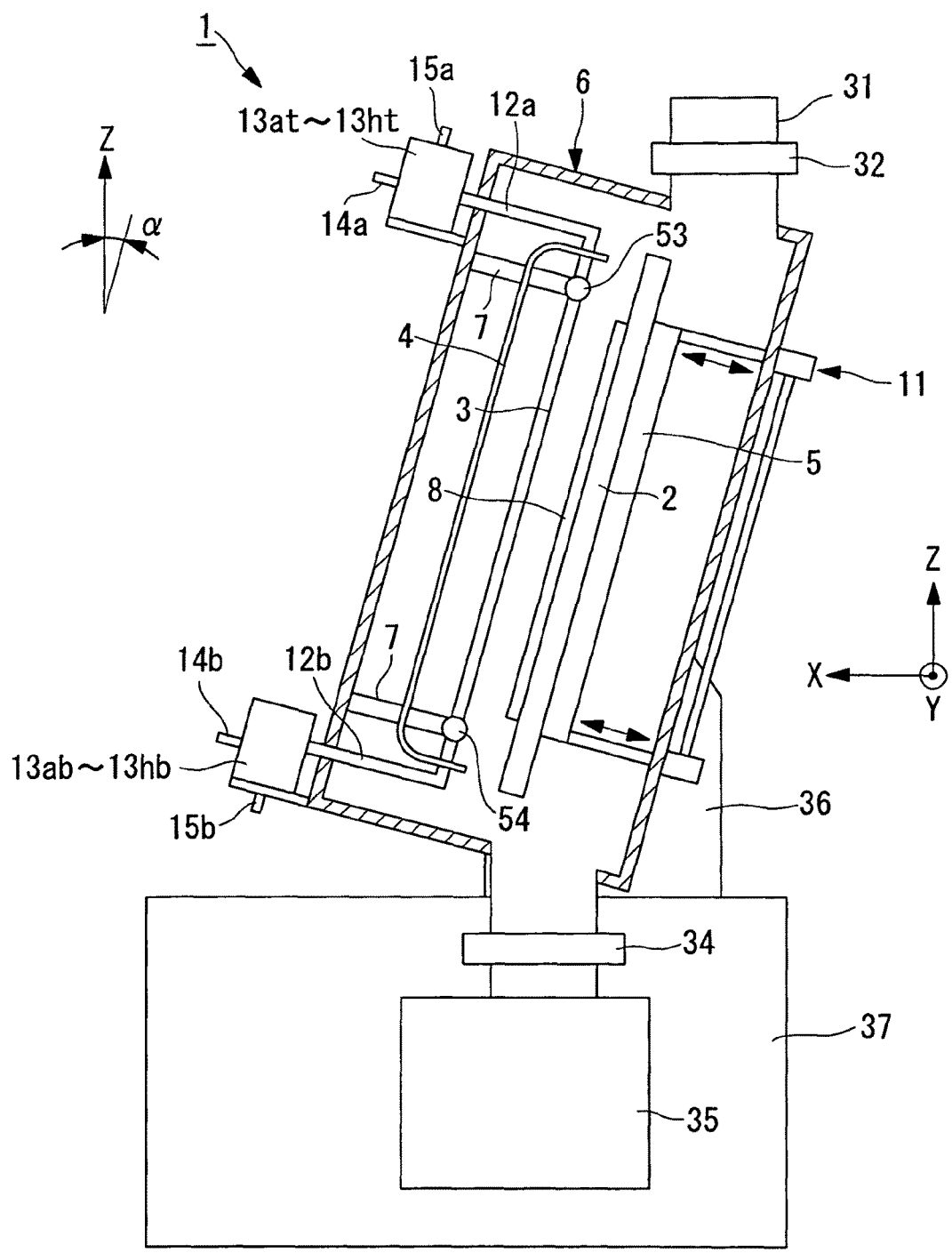
FIG. 1 is a schematic view showing a configuration of a thin-film manufacturing apparatus of a first embodiment of the invention.

FIG. 1 shows a schematic view showing a configuration of a thin-film manufacturing apparatus of the embodiment, which is seen from a side of the thin-film manufacturing apparatus.

In the embodiment, the invention is described while being applied to a thin-film manufacturing apparatus that may perform high-speed deposition processing of a film, including amorphous silicon, microcrystalline silicon, silicon nitride, used for an amorphous solar cell, a microcrystalline solar cell, a TFT (Thin Film Transistor) for a liquid crystal display and the like under a high-pressure narrow-gap condition as a deposition condition, in which the deposition pressure is high and the discharge distance between an electrode and a substrate is narrow.

As shown in FIG. 1, a thin-film manufacturing apparatus (vacuum processing apparatus) 1 has a deposition chamber 6 being a vacuum vessel, a counter electrode 2 being a conductive plate, a soaking plate 5 that makes temperature distribution of the counter electrode 2 to be uniform, a soaking plate holding mechanism 11 that holds the soaking plate 5 and the counter electrode 2, a discharge electrode 3 that generates plasma with respect to the counter electrode 2, a deposition-preventive plate 4 that limits an area in which a film is formed, a support member 7 that supports the deposition-preventive plate 4, coaxial feeding sections 12a and 12b for supplying high-frequency power to the discharge electrode 3 and matching boxes 13at to 13ht and 13ab to 13hb, a high evacuation unit 31 and a low evacuation unit 35 that exhaust gas from the deposition chamber 6, and a stage 37 that holds the deposition chamber 6.

In the figure, a configuration for gas supply is omitted.

The deposition chamber 6 is a vacuum vessel, within which a microcrystalline i layer or the like is deposited on a substrate 8. The deposition chamber 6 is held on the stage 37 at an angle α. The slant angle α is a predetermined angle within a range of 7° to 12° with respect to a z direction (vertical direction).

The deposition chamber 6 is held on a slant, thereby a normal to a deposition processing surface of the substrate 8 on the counter electrode 2 is directed upward (z direction) by the angle α with respect to an x direction. The substrate 8 is slightly slanted from the vertical in this way, which makes it possible to hold the substrate 8 with less work by using the own weight of the substrate 8 while suppressing increase in an installation space of the apparatus, and furthermore, improving an adhesion between the substrate 8 and the counter electrode 2, so that a temperature distribution and a potential distribution on the substrate 8 can be preferably made uniform.

The counter electrode 2 includes a conductive plate of a nonmagnetic material having a holding means (not shown) capable of holding the substrate 8. In the case of performing self-cleaning, the counter electrode preferably has fluorine radical resistance, and a plate of nickel alloy, aluminum or aluminum alloy is preferably used as the counter electrode.

The counter electrode 2 is an electrode (for example, ground electrode) opposed to the discharge electrode 3. The counter electrode 2 is designed such that one surface contacts a surface of the soaking plate 5, and the other surface contacts a surface of the substrate 8 during deposition.

The soaking plate 5 controls a temperature of the soaking plate itself by circulating a heating medium which is controlled in temperature through the inside thereof, or incorporating a heater controlled in temperature, so as to generally have an approximately uniform temperature, and thus has a function of making a temperature of a counter electrode 2 being contacted to be uniform.

The heating medium includes a nonconductive medium. Highly heat-conductive gas such as hydrogen or helium, a fluorine-based inactive liquid, an inactive oil, a pure water and the like may be used for the heating medium. In particular, the fluorine-based inactive liquid (for example, one under a brand name of GALDEN or F05) is preferably used since it can be easily controlled without an increase in pressure even in a range of 150° C. to 250° C.

The soaking plate holding mechanism 11 holds the soaking plate 5 and the counter electrode 2 to be approximately parallel to a side face (right side face in FIG. 1) of the deposition chamber 6, and holds the soaking plate 5, the counter electrode 2 and the substrate 8 such that they may be moved toward or be separated from the discharge electrode 3.

During deposition, the soaking plate holding mechanism 11 may move the soaking plate 5 and the like close to the discharge electrode 3 so that the substrate 8 is situated within a distance range of, for example, 3 mm to 10 mm from the discharge electrode 3.

The deposition-preventive plate 4 is grounded and thus controls a spreading area of the plasma, so that a film deposition area is limited. In the embodiment, as shown in FIG. 1, a film is designed to be not deposited on a wall at a back side (opposite side to the substrate 8) of the deposition-preventive plate 4 within the deposition chamber 6.

The support member 7 perpendicularly extends inward from a side face (left side face in FIG. 1) of the deposition chamber 6. The support member 7 is connected to the deposition-preventive plate 4, and holds the deposition-preventive plate 4 so as to cover a space at an opposite side to the counter electrode 2 with respect to the discharge electrode 3. In addition, the support member 7 is connected to the discharge electrode 3 in an insulative manner, so that the support member holds the discharge electrode 3 to be approximately parallel to the side face (left side face in FIG. 1) of the deposition chamber 6.

The high evacuation unit 31 includes a high-evacuation vacuum pump that further evacuates gas within the deposition chamber 6 being roughly evacuated so that the inside of the deposition chamber 6 is highly evacuated. A valve 32 opens and closes a path between the high evacuation unit 31 and the deposition chamber 6.

The low evacuation unit 35 includes a rough-evacuation vacuum pump that first evacuates gas within the deposition chamber 6, so that the inside of the deposition chamber 6 is roughly evacuated. A valve 34 opens and closes a path between the low evacuation unit 35 and the deposition chamber 6.

The stage 37 holds the deposition chamber 6 via a holding member 36 disposed on a top of the stage. The stage 37 has a region, in which the low evacuation unit 35 is disposed, formed within the stage.

Figure 2:
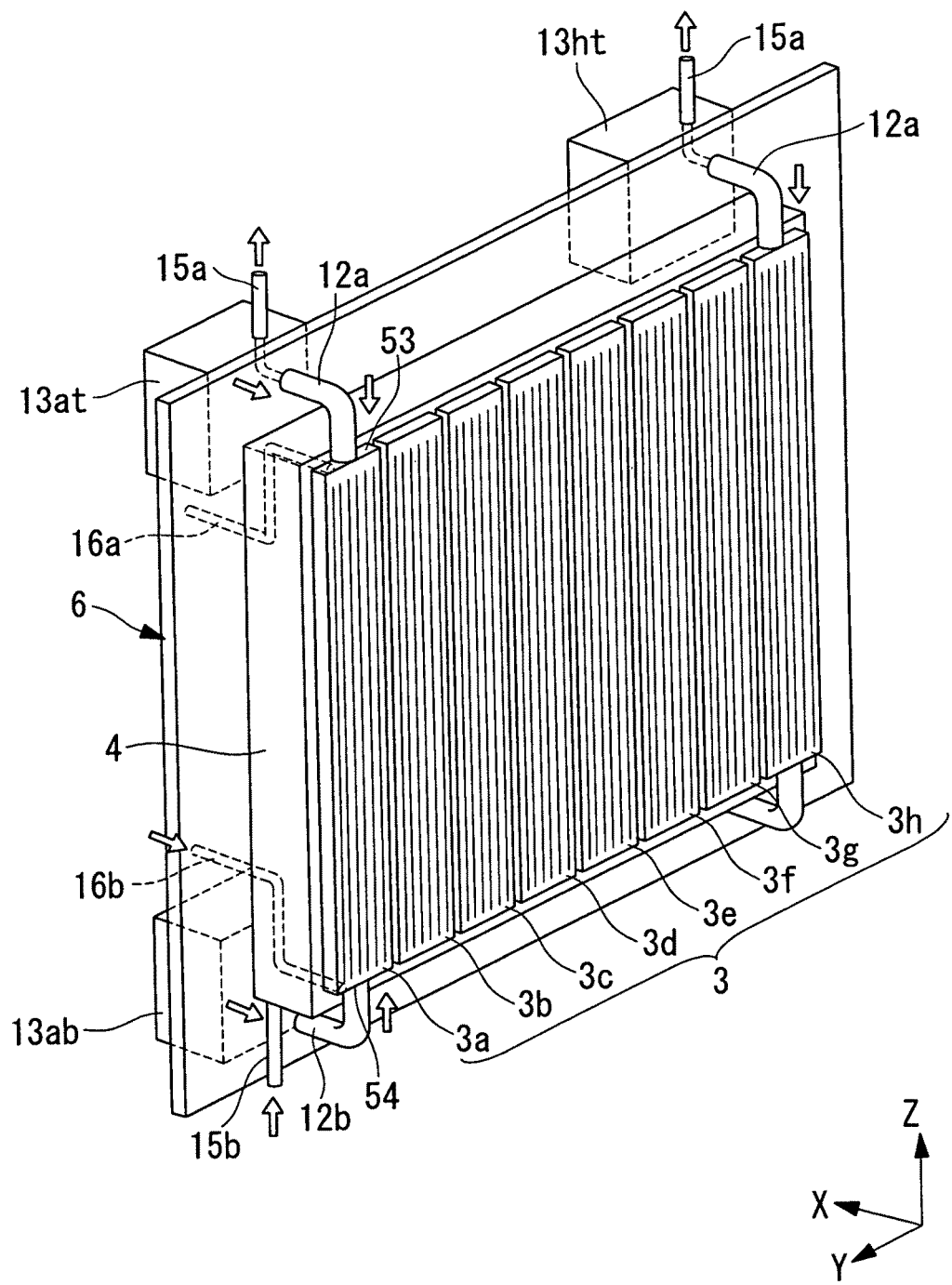
FIG. 2 is a partial perspective view showing a part of the configuration of the thin-film manufacturing apparatus of FIG. 1.
Figure 3:
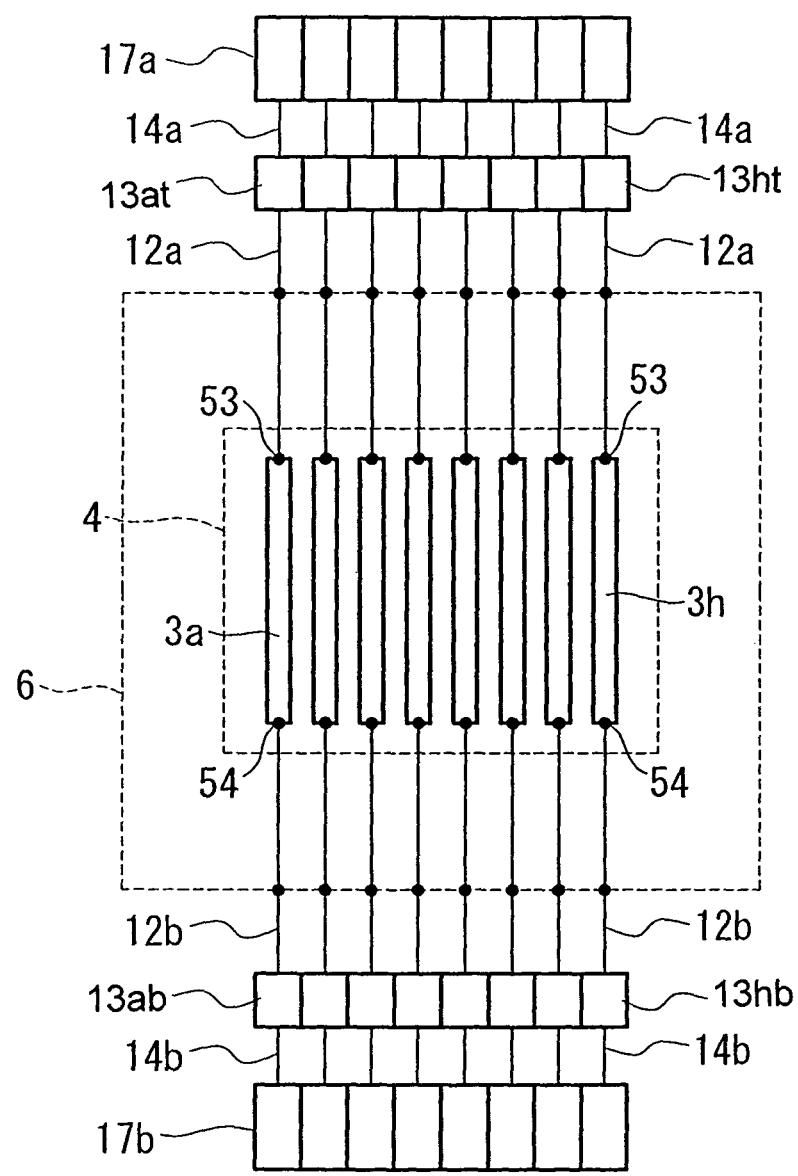
FIG. 3 is a schematic diagram illustrating supply of power to a plurality of discharge electrodes in FIG. 1.

FIG. 2 shows a partial perspective view showing a part of the configuration of the thin-film manufacturing apparatus of FIG. 1. FIG. 3 shows a schematic diagram illustrating supply of power to the plurality of discharge electrodes in FIG. 1.

The embodiment is described while being applied to the thin-film manufacturing apparatus 1 having eight discharge electrodes 3 for each deposition chamber 6. However, the number of discharge electrodes 3 may be larger or smaller than eight, and is not particularly limited.

Regarding the number of discharge electrodes, a width of each discharge electrode is preferably determined so as to eliminate an influence of a standing wave caused by a high-frequency wavelength in a vacuum during plasma generation. It is preferable for forming a uniform plasma that the plurality of discharge electrodes are disposed such that total width thereof is slightly wider than width of the substrate 8 while the electrodes are placed in a row.

As shown in FIGS. 2 and 3, eight discharge electrodes 3a, 3b, 3c, 3d, 3e, 3f, 3g and 3h (hereinafter, mentioned as discharge electrodes 3a to 3h) are provided in the deposition chamber 6. The discharge electrodes 3a to 3h are configured by a combination of two horizontal electrodes disposed at the top and the bottom and extending in an X direction approximately parallel to each other, and a plurality of plate-like longitudinal electrodes extending in a Y direction approximately parallel to one another between the horizontal electrodes.

At a feeding point (end) 53 side of the discharge electrode 3a, a matching box 13at, a high-frequency feeding transmission path 14a, the coaxial feeding section 12a, a heating medium supply tube 15a, and a source gas pipe 16a are provided. At a feeding point (end) 54 side, a matching box 13ab, a high-frequency feeding transmission path 14b, the coaxial feeding section 12b, a heating medium supply tube 15b, and a source gas pipe 16b are provided.

Similarly, for the discharge electrodes 3b to 3h, at a feeding point 53 side, matching boxes 13bt to 13ht, the high-frequency feeding transmission paths 14a, the coaxial feeding sections 12a, the heating medium supply tubes 15a, and the source gas pipes 16a are provided respectively. At a feeding point 54 side, matching boxes 13bb to 13hb, the high-frequency feeding transmission paths 14b, the coaxial feeding sections 12b, the heating medium supply tubes 15b, and the source gas pipes 16b are provided respectively.

In FIG. 2, only the matching boxes 13at, 13ab and 13ht are shown and the other matching boxes are omitted in order to make the figure more clear.

The source gas pipe 16a is connected to a portion near the feeding point 53 of each of the discharge electrodes 3a to 3h. Similarly, the source gas pipe 16b is connected to a portion near the feeding point 54 of each of the discharge electrodes 3a to 3h. Source gas is supplied from the source gas pipes 16a and 16b into the discharge electrodes 3a to 3h, and the discharge electrodes 3a to 3h approximately uniformly discharge the source gas to a counter electrode 2 side (right in FIG. 2).

As shown in FIG. 3, high-frequency power is supplied from a high-frequency power supply (power supply unit) 17a to the feeding point 53 of each of the discharge electrodes 3a to 3h, and high-frequency power is supplied from a high-frequency power supply (power supply unit) 17b to the feeding point 54 thereof.

As shown in FIG. 1, the counter (ground) electrode 2 on which the substrate 8 is placed is disposed at a position parallel to the electrodes 3a to 3h, and high-frequency power is supplied into a space between the electrodes 3a to 3h and the counter (ground) electrode 2, so that plasma is generated.

Specifically, high-frequency power is supplied from the high-frequency power supply 17a to the feeding point 53 of each of the discharge electrodes 3a to 3h via a distributer 19a, the high-frequency feeding transmission path 14a, each of the matching boxes 13at to 13ht, and the coaxial feeding section 12a in this order. Similarly, high-frequency power is supplied from the high-frequency power supply 17b to the feeding point 54 of each of the discharge electrodes 3a to 3h via a distributer 19b, the high-frequency feeding transmission path 14b, each of the matching boxes 13ab to 13hb, and the coaxial feeding section 12b in this order.

Figure 4:
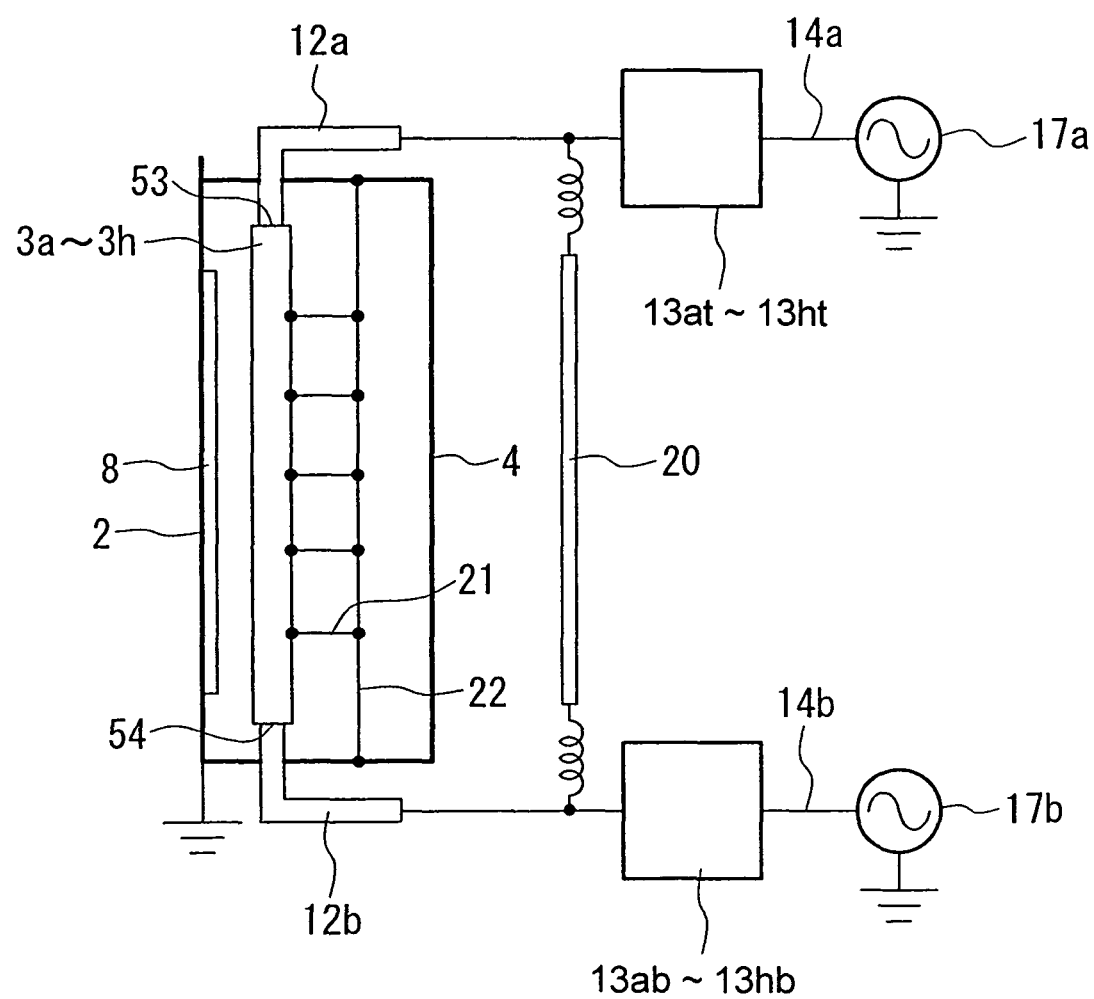
FIG. 4 is a detail diagram illustrating the supply of power to discharge electrodes in FIG. 3.

FIG. 4 shows a detail diagram for illustrating supply of power to the discharge electrodes in FIG. 3.

As shown in FIG. 4, the coaxial feeding section 12a is electrically connected to the coaxial feeding section 12b via a loop circuit 20. As a component configuring the circuit 20, for example, a coaxial cable can be exemplified. However, the embodiment is not limited to this.

The discharge electrodes 3a to 3h are electrically connected to the deposition-preventive plate 4 via a plurality of short bars 21 and a ground bar 22, and the deposition-preventive plate 4 is grounded.

The counter electrode 2 is provided while being opposed to the discharge electrodes 3a to 3h, and grounded.

Figure 5:
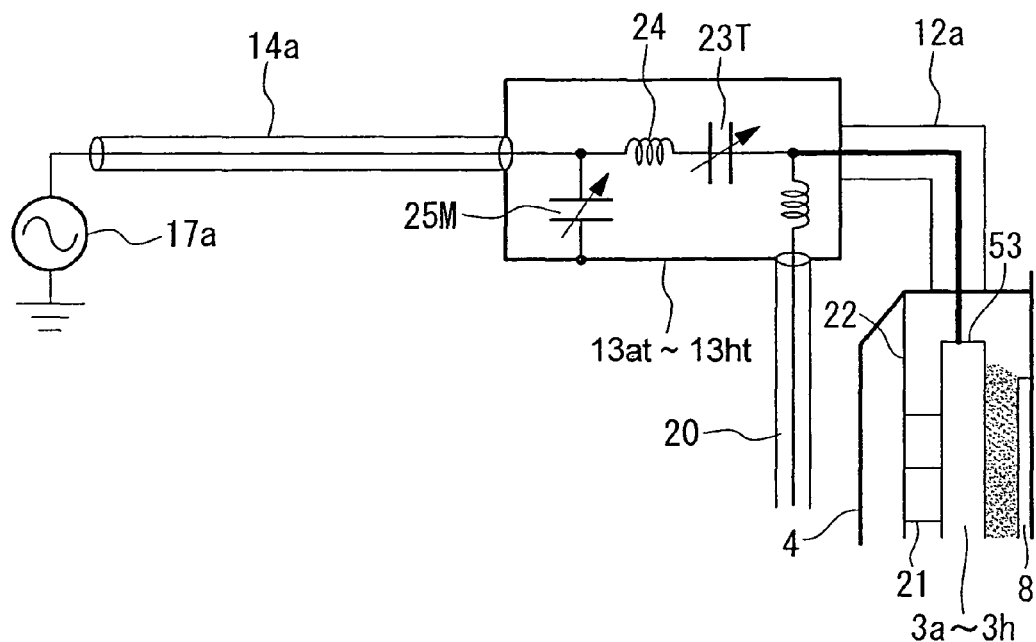
FIG. 5 is a schematic diagram illustrating a configuration of a matching box in FIG. 3.

FIG. 5 shows a schematic diagram for illustrating a configuration of a matching box in FIG. 3.

The matching boxes 13*at* to 13*ht* and 13*ab* to 13*hb* make impedance matchable at an output side. As shown in FIG. 5, the matching boxes 13*at* to 13*ht* and 13*ab* to 13*hb* have a first capacitor (phase tuning section) 23T and a coil 24 for tuning a frequency of the high-frequency power, and a second capacitor (amplitude tuning section) 25M for tuning an amplitude of the high-frequency power.

Both of the first capacitor 23T and the second capacitor 25M are variable capacitors, and a capacitance Ct of the first capacitor 23T and a capacitance Cm of the second capacitor 25M are adjusted, thereby adjusting impedance values of the matching boxes 13*at* to 13*ht* and 13*ab* to 13*hb* respectively.

The first capacitor 23T and the coil 24 are disposed in series between the high-frequency feeding transmission path 14*a* and the coaxial feeding section 12*a*, or between the high-frequency feeding transmission path 14*b* and the coaxial feeding section 12*b*. One end of the second capacitor 25M is electrically connected to the high-frequency feeding transmission path 14*a* or the high-frequency feeding transmission path 14*b*, and the other end thereof is grounded via a housing of the matching boxes 13*at* to 13*ht* and 13*ab* to 13*hb*.

As shown in FIG. 2, the matching boxes 13*ab* to 13*hb* are supplied with a heating medium from a heating medium supply device (not shown) via the heating medium supply tube 15*b*. The supplied heating medium is supplied to each of the discharge electrodes 3*a* to 3*h* via the coaxial feeding section 12*b*. Then, the heating medium flows from each of the discharge electrodes 3*a* to 3*h* into each of the matching boxes 13*at* to 13*ht* via the coaxial feeding section 12*a*, and then sends out from each of the matching boxes 13*at* to 13*ht* to the heating medium supply device (not shown) via the heating medium supply tube 15*a*.

As described before, the heating medium preferably flows from the lower matching boxes 13*ab* to 13*hb* to the upper matching boxes 13*at* to 13*ht*. The heating medium flows in this way, whereby the heating medium can be spread over the inside of the discharge electrode 3 without causing a retention portion or an unreachable portion of the heating medium.

As shown in FIG. 3, the coaxial feeding sections 12*a* and 12*b* supply high-frequency power supplied from the matching boxes 13*at* to 13*ht* and 13*ab* to 13*hb* to the discharge electrode 3. Each of the coaxial feeding sections 12*a* or 12*b* is formed such that one end is electrically connected to each of the discharge electrodes 3*a* to 3*h*, and the other end is electrically connected to each of the matching boxes 13*at* to 13*ht* or 13*ab* to 13*hb*.

The high-frequency power supplies 17*a* and 17*b* supply high-frequency power, for example, power in a frequency band of VHF (Very high-frequency: 30 MHz to 300 MHz), and more preferably power having a frequency of about 40 MHz to 100 MHz respectively. The high-frequency power supplies 17*a* and 17*b* are configured such that the frequency of the high-frequency power to be supplied may be varied, for example, a 60 MHz high-frequency power supply may vary the frequency in a range from 58.5 MHz to 59.9 MHz, or 60.1 MHz to 61.5 MHz.

Next, a tuning method of the thin-film manufacturing apparatus 1 including the above configuration will be described.

First, one of the plurality of discharge electrodes 3*a* to 3*h*, for example, a discharge electrode 3*a* is selected, and an impedance value $Z_0$ ($Z_0 = R_0 + jX_0$) of each of the matching boxes 13*at* and 13*ab* is determined, at which reflected power returned from the discharge electrode 3*a* is approximately minimized (reflected power control step).

Here, a matching box associated with the selected discharge electrode is denoted as a representative matching box.

The description that reflected power is approximately minimized means that a difference between a minimum value of a reflected wave and a reflection value after tuning is at most 20% of supplied power, and more preferably at most 10%, which implies tuning to a state that a reflected wave substantially has an approximate minimum value.

As described before, a matching box associated with an optional discharge electrode may be selected as the representative matching box. Alternatively, it is acceptable to select an optional discharge electrode from discharge electrodes 3*b* to 3*g* except the discharge electrodes 3*a* and 3*h* on either side, and a matching box associated with the selected discharge electrode may be selected as the representative matching box. That is, the representative matching box is not particularly limited.

Figure 6:
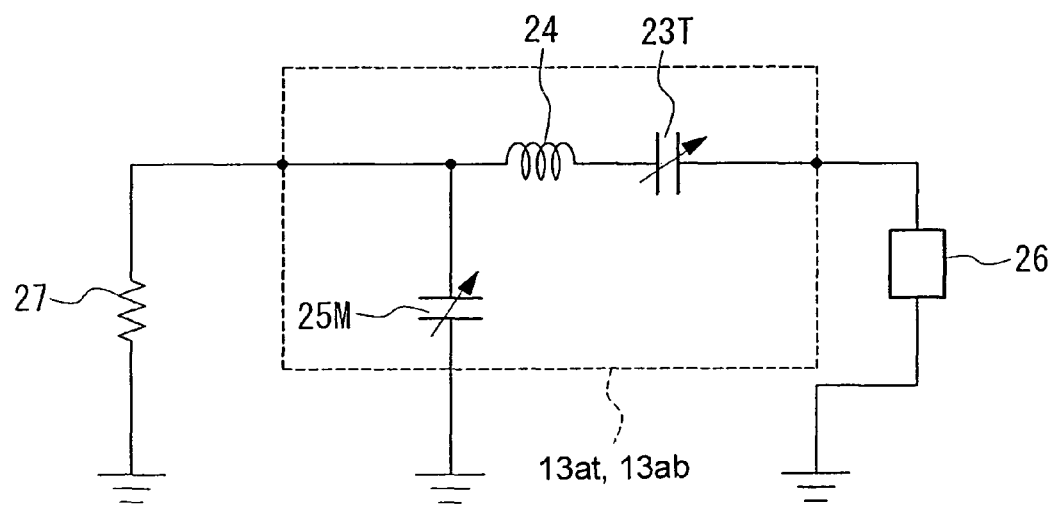
FIG. 6 is a diagram illustrating a method of measuring an impedance value of a matching box.

FIG. 6 shows a diagram for illustrating a method of measuring an impedance value of a matching box.

Specifically, a capacitance Ct of the first capacitor 23T and a capacitance Cm of the second capacitor 25M of the representative matching boxes 13*at* and 13*ab* that tune the frequency and the amplitude of high-frequency power to be supplied to the discharge electrode 3*a* are adjusted so that reflected power returned from the discharge electrode 3*a* is minimized.

Then, the impedance value $Z_0$ of each of the representative matching boxes 13*at* and 13*ab* is measured. Specifically, as shown in FIG. 6, each of the representative matching boxes 13*at* and 13*ab* is separated from the discharge electrode 3*a*, and connected with a network analyzer 26, and separated from each of the high-frequency power supplies 17*a* and 17*b*, and connected with a resistance 27. As a value of the resistance 27, for example, a value of 50Ω is exemplified.

Then, an impedance value Z of each of remaining matching boxes 13*bt* to 13*ht* and 13*bb* to 13*hb* is adjusted to the value $Z_0$ (setting step).

Specifically, as described before, the network analyzer 26 is used, and while the impedance value Z of each of the matching boxes 13*bt* to 13*ht* and 13*bb* to 13*hb* is measured, values of the capacitance Ct and the capacitance Cm are adjusted, thereby the impedance value of each of the matching boxes 13*bt* to 13*ht* and 13*bb* to 13*hb* is adjusted to the value $Z_0$.

Next, a thickness distribution of a film deposited using the thin-film manufacturing apparatus 1 tuned according to the tuning method will be described.

Here, a case of depositing a microcrystalline i layer is described. In evaluation, the following are set as materials used for deposition and as deposition conditions.

A distance between a substrate and an electrode is set to a predetermined value of 10 mm or less. A ratio of $H_2$ to $SiH_4$ being source gases is set to $H_2/SiH_4 \approx 50$. Furthermore, deposition pressure is set to a predetermined value between 1000 Pa and 2000 pa, and substrate temperature is set to about 200° C.

Such deposition conditions are set using known materials and known conditions, and are not particularly limitative.

Figure 7:
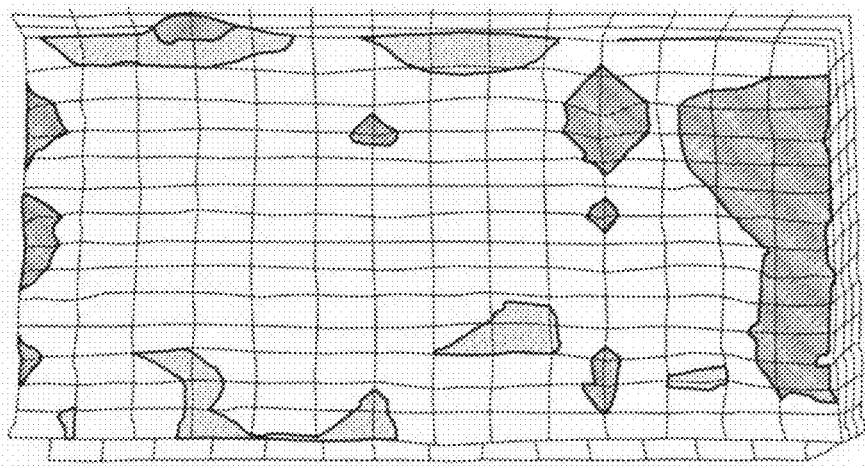
FIG. 7 is a view illustrating a thickness distribution of a film deposited using a thin-film manufacturing apparatus tuned according to a prior method.
Figure 8:
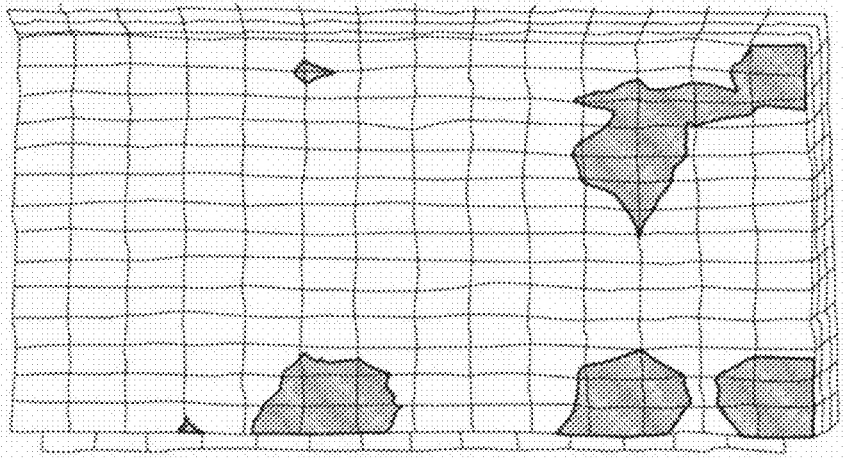
FIG. 8 is a view illustrating thickness distribution of a film deposited using a thin-film manufacturing apparatus tuned according to a tuning method of the embodiment.

FIG. 7 shows a view for illustrating thickness distribution of a film deposited using a thin-film manufacturing apparatus tuned according to a prior method. FIG. 8 shows a view for illustrating thickness distribution of a film deposited using a thin-film manufacturing apparatus tuned according to the tuning method of the embodiment.

FIGS. 7 and 8 show thickness distribution in a case in which total power supplied to the plurality of discharge electrodes is 24 kW respectively. It is known that the thickness distribution shown in FIG. 7 is large in variation (gray area is large) compared with the thickness distribution shown in FIG.

8. Specifically, as shown in the following table, the thickness distribution on FIG. 7 (prior art) is ±25.7%, and the thickness distribution on FIG. 8 (the embodiment) is ±13.7%.

In the table, data described in an upper column "prior plasma tuning method" show a thickness distribution and a deposition speed of a film deposited using the thin-film manufacturing apparatus tuned according to the prior tuning method, and data described in a lower column "new plasma tuning method" show a thickness distribution and a deposition speed of a film deposited using the thin-film manufacturing apparatus tuned according to the tuning method of the embodiment.

TABLE 1

|  |  | Distribution | Deposition speed |
|---|---|---|---|
| Prior plasma tuning method | 24 kW | ±25.7% (except abnormal points) | 2.15 nm/s |
| New plasma tuning method | 24 kW | ±13.7% | 2.13 nm/s |
|  | 28 kW | ±17.2% | 2.57 nm/s |

Deposition speed is 2.15 nm/s in the prior method, and 2.13 nm/s in the embodiment, which are approximately the same. In the embodiment, in the case that total power supplied to the plurality of discharge electrodes is 28 kW, the thickness distribution is ±17.2%, and the deposition speed is 2.57 nm/s, that is, the deposition speed is increased while suppressing variation in the thickness distribution.

The impedance tuning of the matching boxes 13*at* to 13*ht* and 13*ab* to 13*hb* is performed when the thin-film manufacturing apparatus 1 is assembled or subjected to start-up tuning. The impedance tuning may be performed during maintenance of the thin-film manufacturing apparatus 1, and for example, the impedance tuning is performed during maintenance involving replacement of the discharge electrodes 3*a* to 3*h*.

According to the tuning method, a difference in impedance value Z does not exist between the matching boxes 13*at* to 13*ht* and 13*ab* to 13*hb*. Alternatively, even if such a difference exists, the difference is reduced. Impedance of the respective matching boxes connected to the discharge electrodes 3*a* to 3*h* are made uniform beforehand, thereby respective tuning points are approximately uniformly made when a film is deposited on the substrate 8, and phases and amplitudes are made uniform at respective feeding points of the discharge electrodes at the same time. Therefore, the occurrence of a potential difference is suppressed between the respective discharge electrodes, and consequently electrical interference between the respective discharge electrodes is suppressed.

Since the thickness distribution is prevented from being disturbed (degraded) by electrical interference, a variation in the thickness distribution of a film deposited on the substrate 8 is suppressed, and consequently the thickness distribution can be improved. Therefore, even in the case in which the thin-film manufacturing apparatus 1 has a plurality of deposition chambers 6, a variation in the thickness distribution between the respective deposition chambers 6, that is, an occurrence of a difference in the deposition characteristic is suppressed.

Since the respective tuning points are substantially uniformly made in approximately the same manner between many deposition processing batches, the thickness distribution of a film deposited on the substrate 8 is similarly stabilized. Thus, reproducibility is improved between deposition processing batches, and consequently a yield can be improved.

Since the impedance value Z of each of the matching boxes 13*at* to 13*ht* and 13*ab* to 13*hb* is adjusted to the impedance value $Z_0$ at which reflected power returned from the discharge electrode 3*a* selected as the representative is reduced, reflected power returned from the plurality of discharge electrodes 3*a* to 3*h* as a whole can be approximately minimized or reduced. That is, since reflected power returned from the plurality of discharge electrodes 3*a* to 3*h* as a whole is reduced compared with reflected power returned from each of other discharge electrodes 3*b* to 3*h* approximately similarly as reflected power returned from the discharge electrode 3*a*, reflected power returned from the discharge electrodes 3*a* to 3*h* is approximately minimized. Thus, high-frequency power is effectively supplied to all the discharge electrodes 3*a* to 3*h* and contributes to plasma generation, and consequently deposition speed can be increased.

Since the impedance values Z of the matching boxes 13*at* to 13*ht* and 13*ab* to 13*hb* can be measured by the network analyzer 26, compared with a method where phases and amplitudes of high-frequency power are individually made uniform to suppress a variation in the thickness distribution, the impedance values Z of the matching boxes 13*at* to 13*ht* and 13*ab* to 13*hb* can be easily made uniform. Therefore, a deposition characteristic can be easily controlled so as to make the thickness distribution uniform. That is, the impedance values Z are easily made uniform, thereby a variation in the thickness distribution can be suppressed.

Compared with a method where a phase tuning means is disposed for each high-frequency power supply to tune a phase of high-frequency power, a phase tuning function need not be individually provided, which enables a reduction in equipment cost.

Since the impedance value Z of each of the matching boxes 13*at* to 13*ht* and 13*ab* to 13*hb* can be adjusted by the first capacitor 23T and the second capacitor 25M, the impedance value Z of each of the matching boxes 13*at* to 13*ht* and 13*ab* to 13*hb* can be easily set to approximately the same value $Z_0$.

Second Embodiment

Next, a second embodiment of the invention is described.

In a thin-film manufacturing apparatus of the embodiment, a basic configuration is the same as that of the first embodiment, but an impedance tuning method of a matching box is different from that of the first embodiment. Therefore, in the embodiment, only the impedance tuning method of a matching box is described, and description of other components and the like is omitted.

The same components as in the first embodiment are referenced by the same symbols, and a description thereof is omitted.

A tuning method of a thin-film manufacturing apparatus 1 of the embodiment is described.

First, a step of selecting a predetermined discharge electrode (here, description is made using a case that a discharge electrode 3*b* is selected), a step of determining an impedance value $Z_0$ of each of representative matching boxes 13*bt* and 13*bb*, and a step that an impedance value of each of all matching boxes 13*at*, 13*ct* to 13*ht*, 13*ab*, and 13*cb* to 13*hb* is adjusted to $Z_0$ are the same as in the first embodiment, therefore description of the steps is omitted.

Then, values of capacitance Cm of second capacitors 25M of all matching boxes 13*at*, 13*ct* to 13*ht*, 13*ab*, and 13*cb* to 13*hb* are adjusted with the same change amount at the same time, so that each capacitance is set to a value at which reflected power returned from discharge electrodes 3*a* to 3*h* is minimized (amplitude tuning step).

According to the configuration, since amplitude of high-frequency power supplied to a plurality of discharge electrodes 3a to 3h are tuned with the same change amount at the same time, impedance values of a plurality of matching boxes 13at to 13ht and 13ab to 13hb are kept to approximately the same value, and reflected power returned from a plurality of discharge electrodes 3a to 3h can be approximately minimized.

Compared with a method where reflected power is further reduced by individually tuning phases of the high-frequency power supplied to the plurality of discharge electrodes 3a to 3h, since impedance values of the plurality of matching boxes 13at to 13ht and 13ab to 13hb are approximately the same, a variation in the thickness distribution of a film deposited on the substrate 8 can be suppressed.

As described before, when impedance of each of matching boxes 13at to 13ht and 13ab to 13hb is made uniform, it is acceptable that while an impedance value is measured by the network analyzer 26, capacitance Ct of the first capacitor 23T and capacitance Cm of the second capacitor 25M are adjusted to make the impedance value uniform. Alternatively, it is acceptable that a relationship between an impedance value of each of matching boxes 13at to 13ht and 13ab to 13hb, and the capacitance Ct of the first capacitor 23T and the capacitance Cm of the second capacitor 25M is adjusted beforehand to be the same among all the matching boxes 13at to 13ht and 13ab to 13hb, so that the impedance value is made uniform only by tuning the capacitance Ct of the first capacitor 23T and the capacitance Cm of the second capacitor 25M without using the network analyzer 26.

According to such a configuration, the time and number of steps, which are required for adjusting impedance of each of matching boxes 13at to 13ht and 13ab to 13hb to be uniform, can be decreased.

Third Embodiment

Next, a third embodiment of the invention is described.

In a thin-film manufacturing apparatus of the embodiment, a basic configuration is the same as that of the first embodiment, but an impedance tuning method of a matching box is different from that of the first embodiment. Therefore, in the embodiment, only the impedance tuning method of a matching box is described, and description of other components and the like is omitted.

The same components as in the first embodiment are referenced by the same symbols, and a description thereof is omitted.

A tuning method of a thin-film manufacturing apparatus 1 of the embodiment is described.

First, a step of selecting a predetermined discharge electrode (here, description is made using a case that a discharge electrode 3b is selected), a step of determining an impedance value $Z_0$ of each of the representative matching boxes 13bt and 13bb, and a step in which the impedance values of all matching boxes 13at to 13ht and 13ab to 13hb are adjusted to $Z_0$ are the same as in the first embodiment, and therefore description of the steps is omitted.

Then, for a discharge electrode having a large reflected power among the discharge electrodes 3a to 3h, capacitance Cm of the second capacitor 25M of a matching box is adjusted to a value at which reflected power is minimized (amplitude change step).

According to the configuration, compared with a method where impedance values of all matching boxes 13at to 13ht and 13ab to 13hb are kept to approximately the same value, since the reflected power returned from a discharge electrode having a large reflected power is relatively small, reflected power returned from the discharge electrodes 3a to 3h as a whole is also relatively small, and approximately minimized.

Regarding the plurality of discharge electrodes in the invention, a combination of a plurality of longitudinal electrodes is used to describe the embodiments. However, a structure of the discharge electrodes is not limited to this. For example, the invention may be applied to a configuration in which multiply divided, parallel-plate discharge electrodes are formed, and power is supplied to each of feeding points of the parallel-plate discharge electrodes via a respective matching box.

The invention claimed is:

1. A vacuum processing apparatus comprising:
a plurality of plate-like discharge electrodes that is supplied with high-frequency power from a power supply unit through feeding points thereof, and forms plasma with respect to a substrate placed on a counter electrode respectively, and
a plurality of matching boxes,
wherein one end of each of the plurality of discharge electrodes is electrically connected to another end of each of the plurality of discharge electrodes via a loop circuit,
wherein the plurality of matching boxes tunes phases and amplitude of the high-frequency power supplied to the plurality of discharge electrodes at the feeding points respectively,
wherein the plurality of matching boxes includes one matching box which is configured to tune the high-frequency power supplied to one discharge electrode, the one matching box corresponding to the one discharge electrode,
wherein the one matching box is configured to set an impedance value such that a reflected power returned from the one discharge electrode to the power supply unit is approximately minimized,
wherein impedance values of the plurality of matching boxes are set to approximately the same value as a measured value obtained by measuring the impedance of the one matching box, and
wherein the vacuum processing apparatus is configured to perform
reflected-power tuning, in which among the plurality of matching boxes that tunes phases and amplitudes of the high-frequency power supplied to the plurality of discharge electrodes that form plasma with respect to the substrate placed on the counter electrode respectively, impedance of the one matching box, which tunes the high-frequency power supplied to the one discharge electrode, is set such that reflected power returned from the one discharge electrode is approximately minimized, and
setting, in which the impedance of other matching boxes is set to approximately the same impedance as the impedance of the one matching box.

2. The vacuum processing apparatus according to claim 1, wherein the plurality of matching boxes includes phase tuning sections that tune the phases of the high-frequency power supplied to the plurality of discharge electrodes respectively, and
amplitude tuning sections that tune the amplitude of the high-frequency power respectively.

3. The vacuum processing apparatus according to claim 1, wherein each of the matching boxes includes an adjustable first capacitor and a coil for tuning a frequency of the high-frequency power, and an adjustable second capacitor for tuning an amplitude of the high-frequency power.

4. The vacuum processing apparatus according to claim 3, wherein each of the discharge electrodes includes two feeding points of the high-frequency power, the feeding points being connected together to form the loop circuit.

5. A vacuum processing apparatus comprising:
- a plurality of plate-like discharge electrodes that are supplied with high-frequency power from a power supply unit and that form plasma with respect to a substrate placed on a counter electrode;
- a loop circuit that electrically connects one end of each of the plurality of discharge electrodes to another end of each of the plurality of discharge electrodes; and
- a plurality of matching boxes that correspond to the plurality of discharge electrodes, respectively, and that are connected between the power supply unit and the plurality of discharge electrodes,
- wherein one matching box among the plurality of matching boxes is configured to be set to have an impedance value such that a reflected power returned from one discharge electrode among the plurality of discharge electrodes to the power supply unit is approximately minimized, the one discharge electrode corresponding to the one matching box, and
- wherein each of the plurality of matching boxes except for the one matching box is configured to be set to have an impedance value that is approximately the same as the impedance value set in the one matching box.

6. The vacuum processing apparatus according to claim 5, wherein each of the plurality of matching boxes includes a phase tuning section that is configured to be capable of tuning phases of the high-frequency power, and an amplitude tuning section that is configured to be capable of tuning amplitude of the high-frequency power, and
wherein each of the plurality of matching boxes is configured to be set to have an impedance value by adjustment of the phase tuning section and the amplitude tuning section.

* * * * *